United States Patent
Roy

(10) Patent No.: US 7,151,286 B2
(45) Date of Patent: Dec. 19, 2006

(54) PHOTODIODE HAVING THREE DOPED REGIONS, PHOTODETECTOR INCORPORATING SUCH A PHOTODIODE AND METHOD OF OPERATING SUCH A PHOTODETECTOR

(75) Inventor: Francois Roy, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 211 days.

(21) Appl. No.: 10/875,694

(22) Filed: Jun. 24, 2004

(65) Prior Publication Data

US 2005/0006677 A1 Jan. 13, 2005

(30) Foreign Application Priority Data

Jul. 8, 2003 (FR) .................................. 03 08326

(51) Int. Cl.
*H01L 31/113* (2006.01)
(52) U.S. Cl. ................ 257/291; 257/292; 257/E27.133
(58) Field of Classification Search ........ 257/290–294, 257/E27.133
See application file for complete search history.

(56) References Cited

U.S. PATENT DOCUMENTS

| 3,532,945 | A |   | 10/1970 | Weckler ...................... 317/235 |
| 4,520,381 | A |   | 5/1985  | Moriguchi et al. ........... 357/30 |
| 5,113,076 | A |   | 5/1992  | Schulte .................. 250/370.06 |
| 5,892,253 | A |   | 4/1999  | Merrill ....................... 257/292 |
| 2005/0051702 | A1 | * | 3/2005 | Hong et al. .............. 250/214.1 |
| 2005/0202584 | A1 | * | 9/2005 | Mouli ......................... 438/48 |

* cited by examiner

*Primary Examiner*—Minh-Loan Tran
(74) *Attorney, Agent, or Firm*—Lisa K. Jorgenson; David V. Carlson; Seed IP Law Group PLLC

(57) ABSTRACT

A photodiode comprises three superposed doped regions, namely a first doped region adjacent to a surface (S) of a semiconductor substrate, an intermediate second doped region and a third doped region in contact with the bulk of the substrate. The bulk of the substrate and the second doped region form first and second electrodes of the photodiode, respectively. The photodiode furthermore includes a third electrode in contact with the first doped region. The third electrode comprises an intermediate portion of a first electrically conducting material, placed in contact with the first doped region, and an external connection portion of a second electrically conducting material, placed in contact with the intermediate portion.

8 Claims, 1 Drawing Sheet

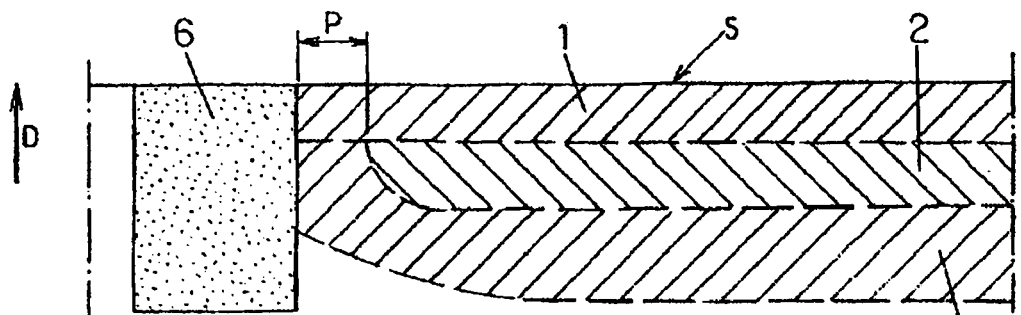
FIG. 1
*(Prior Art)*
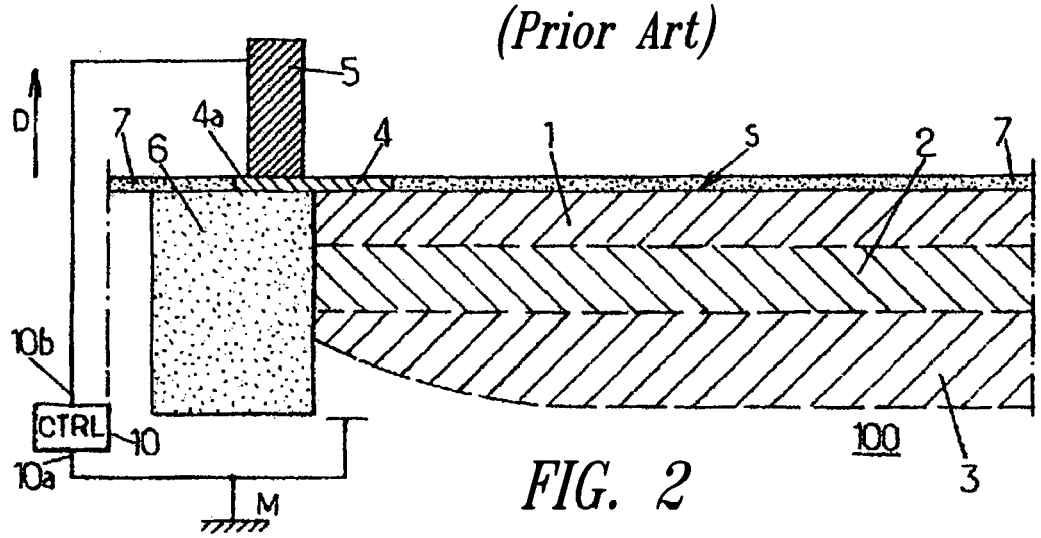
FIG. 2
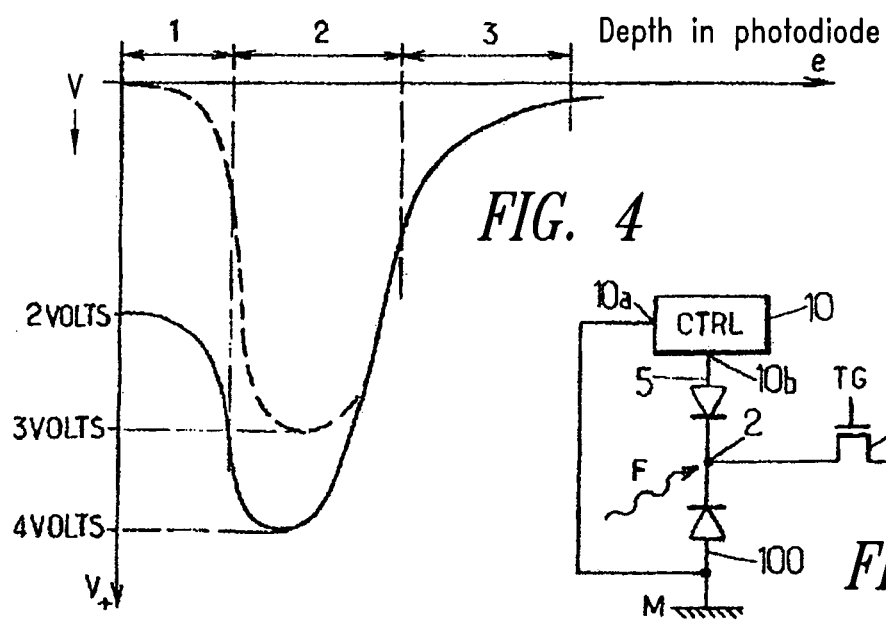
FIG. 4
FIG. 3

PHOTODIODE HAVING THREE DOPED REGIONS, PHOTODETECTOR INCORPORATING SUCH A PHOTODIODE AND METHOD OF OPERATING SUCH A PHOTODETECTOR

BACKGROUND OF THE INVENTION

Field of the Invention

The present invention relates to a photodiode of the pinned photodiode type. Such photodiodes are used especially in photodetectors as photosensitive components.

DESCRIPTION OF THE RELATED ART

FIG. 1 shows a known pinned photodiode configuration. It consists of a stack of three doped regions formed within a semiconductor substrate 100, beneath a surface S of the latter. A first doped region 1, for example of p type, is located beneath the surface S at a depth in the substrate of around 50 nanometers approximately. A second doped region 2, of n type, lies parallel to and against the region 1 within the substrate 100, on the opposite side of the region 1 from the surface S. The region 2 extends down to a depth of approximately 400 nanometers within the substrate 100. A third doped region 3, of p type, lies parallel to and against the region 2, on the opposite side of the latter from the region 1. The region 3 is in electrical contact with the bulk of the substrate 100, which is generally connected to an electrical earth and constitutes the anode of the photodiode. The region 2 constitutes the cathode of the photodiode.

The photodiode thus formed has two electrical junctions, firstly between the regions 1 and 2 and secondly between the regions 2 and 3. This configuration allows the reset noise of the photodiode to be eliminated. It also makes it possible to increase the storage capacity in the photodiode of the electrical charges generated. In fact, such a photodiode has an electrical charge storage volume of more or less twice that of a simple photodiode.

According to the configuration shown in FIG. 1, the region 1 is electrically connected to the region 3 via a direct contact between the regions 1 and 3 within the substrate 100. This contact is located practically above a portion P of the surface S in a direction D perpendicular to the surface S. The portion P therefore causes a reduction in the electrical charge storage capacity of the photodiode. The total portion of the surface S occupied by the photodiode is bounded, in a known manner, by a belt of insulating material 6 that surrounds the photodiode, for example of the STI (Shallow Trench Insulator) type.

BRIEF SUMMARY OF THE INVENTION

It is an object of the invention to reduce the aforementioned drawbacks of pinned photodiodes.

The invention relates to a photodiode having three doped regions, comprising a portion of a semiconductor substrate adjacent to a surface of the substrate, and comprising, in said portion of the substrate:

a first doped region, doped with a first type of doping, adjacent to the surface of the substrate;

a second doped region, doped with a second type of doping different from the first type, located on the opposite side from the first doped region with respect to the surface of the substrate; and a third doped region, doped with the first type of doping, located on the opposite side from the second doped region with respect to the first doped region.

A bulk of the substrate and the second doped region form first and second electrodes of the photodiode, respectively. The photodiode furthermore includes a third electrode in contact with the first doped region. The third electrode comprises:

an intermediate portion of a first electrically conducting material, placed in contact with the first doped region; and an external connection portion of a second electrically conducting material, placed in contact with the intermediate portion.

Thus, according to the invention, the first doped region is provided with a specific electrode for electrically connecting the first doped region via the outside of the photodiode. In particular, the first doped region may be electrically connected to the bulk of the substrate via the third electrode. It may also be connected to an electrical potential source for applying an electrical potential different from that of the bulk of the substrate to the first doped region.

A first advantage of the invention lies in the absence of direct contact within the substrate between the first and third doped regions. No portion of the surface of the substrate is therefore inhibited by such direct contact. This results in an increased capacity to store electrical charges in the photodiode relative to the surface portion of the substrate occupied by the photodiode.

A second advantage of the invention results from the structure of the third electrode. This structure makes it possible to select, for the intermediate portion, a first conducting material suitable for establishing good electrical contact with the first doped region, without damaging the latter. The second conducting material of the external connection portion may be selected independently of the material of the substrate. In particular, it may be selected according to the technology used to make the electrical connections. The first and second conducting materials may therefore be different.

The invention also relates to a photodetector comprising a photodiode of the above type and comprising a control circuit connected via a first terminal to the bulk of the substrate and via a second terminal to the external connection portion. The control circuit is designed to apply a variable electrical potential to the external connection portion between a first instant for generating electrical charges in the photodiode and a second instant for transferring the electrical charges generated out of the photodiode, the electrical potential of the bulk of the substrate being taken as reference.

Such a photodetector allows the electrical potential of the first doped region of the photodiode to be adapted during an operating cycle of the photodetector. In particular, the electrical potential applied to the external connection portion is chosen so as to increase the quantity of electrical charge that can be stored in the photodiode during an electrical charge photogeneration step. The dynamic range of the photodetector is thus increased thereby.

Finally, the invention relates to the method of controlling a photodetector of the above type.

BRIEF DESCRIPTION OF THE SEVERAL VIEWS OF THE DRAWING (S)

Other features and advantages of the present invention will become apparent in the description below of a non-limiting embodiment with reference to the appended drawings, in which:

FIG. 1 shows a pinned photodiode according to a known configuration;

FIG. 2 shows a pinned photodiode according to the invention;

FIG. 3 is a circuit diagram of a photodetector comprising a photodiode according to FIG. 2; and FIG. 4 is a graph of the electrical potential in a photodiode according to FIG. 2.

DETAILED DESCRIPTION OF THE INVENTION

For the sake of clarity, the dimensions of the various elements shown in FIGS. 1 and 2 are not in proportion to their actual dimensions. These two figures are sectional views of substrates each supporting a photodiode located beneath an approximately planar surface of the substrate. The sectional views are considered in planes perpendicular to the surface of each substrate. The substrate is placed in the lower part of each figure and D denotes a direction perpendicular to the surface of the substrate, directed upwards in each figure. In the rest of the text, the terms "on", "beneath", "lower" and "upper" are used with reference to this orientation. Moreover, in all the figures identical references correspond to identical elements.

FIG. 1, which shows a pinned photodiode according to a known configuration, has already been described.

According to FIG. 2, a pinned photodiode according to the invention comprises a stack of three doped regions superposed along the direction D, beneath the surface S of the substrate 100. The region 1 is adjacent to the surface S and the region 3 is in contact with the bulk of the substrate 100. The regions 1 and 2 have, for example, respective thicknesses, in the direction D, of 50 nanometers and 400 nanometers approximately. The regions 1 and 3 are, for example, of p type. The region 2 is then of n type and constitutes the cathode of the photodiode. The regions 1–3 of the stack are bounded by part of an insulating volume 6, which may be of the STI type.

The photodiode includes a control electrode made in two portions, namely an intermediate portion 4 and an external connection portion 5.

The intermediate portion 4 is placed on the surface S, astride the region 1, with which it is in direct contact, and the volume 6. When the substrate 100 is based on silicon, the intermediate portion 4 may, for example, be made of electrically conducting polycrystalline silicon, or polysilicon. The electrical behavior of the region 1 is therefore unaffected by any diffusion into the region 1 of atoms coming from the portion 4, since the latter contains no foreign atoms, differing from silicon, or else contains only very small quantities thereof, quantities that are insufficient to impair the electrical behavior of the region 1. Moreover, no undesirable alloy is formed at the interface between the region 1 and the portion 4. Thanks to this choice of material for the portion 4, a low contact resistance is obtained between the region 1 and the portion 4.

A possible method for producing the intermediate portion 4 consists in depositing on the surface S a layer 7 of at least one insulating material different from the material of the substrate 100 and from the material of the portion 4. This may, for example, be a layer of silica $SiO_2$ 20 nanometers in thickness. An aperture corresponding to the position of the portion 4 on the surface S is made in the layer 7, in a known manner, by combining a photolithographic masking process with selective etching of the silica. Before removal of the mask, the portion 4 is formed by depositing polysilicon. Thus, the silicon material of the substrate 100 is left intact, and the region 1 is not damaged at the location where it is in contact with the portion 4, despite its very small thickness along the direction D.

An external connection portion 5 of the control electrode is placed above the intermediate portion 4, in contact with the upper surface of the latter. The portion 5 is, for example, a metal via produced in damascene technology known to those skilled in the art. The portion 5 is placed within a layer of insulating material (not shown) placed above the surface S of the substrate 100. Such a layer is transparent if it covers the region 1. In damascene technology, the volume to be occupied by the portion 5 is initially etched away by anisotropic dry etching, parallel to the direction D but in the opposite sense. The intermediate portion 4 possesses an extension 4a supported by the volume 6, and the portion 5 is in the contact with the extension 4a. Thus, the portion 5 is shifted, parallel to the surface S, relative to the region 1. This shift eliminates any risk of the region 1 being damaged during the anisotropic etching of the damascene process. This is because the region 1, owing to its very small thickness along the direction D, could be rapidly broached or penetrated during anisotropic etching if the etching front were to reach the surface S in the region 1.

The external connection portion 5 is made, for example, of a metal such as aluminum, copper, cobalt, tungsten, titanium or an alloy of these metals. Thanks to the presence of the intermediate portion 4, any formation of a silicide-type alloy between the metal and the silicon is avoided. The electrical behavior of the region 1 is therefore preserved from any impairment resulting from the production of an external electrical contact on the region 1.

This external connection portion (5), and the intermediate portion (4) may also be made of the same material.

FIG. 3 is a circuit diagram of a photodetector comprising the above pinned photodiode. The latter is represented by two standard diode symbols placed in opposition. It is illuminated by a light flux F. The intermediate point between the two diode symbols corresponds to the region 2 that is connected to the source of a transistor 11 for transferring the electrons from the photodiode to a sensing node SN. Electron transfer may be controlled by the gate TG of the transistor 11. As in FIG. 2, a control circuit (CTRL) 10 is furthermore connected via a first terminal 10a to earth M and to the bulk of the substrate 100, and via a second terminal 10b to the control electrode of the photodiode, more precisely to its external connection portion 5. A third terminal of the circuit 10 may furthermore be connected to the gate TG.

An operating cycle of such a photodetector comprises, in a known manner, a step of generating electrons in the photodiode by the flux F and a step of transferring the electrons generated to a sensing node (not shown) from which the number of electrons generated is read. In order for the photodetector to operate correctly, the electron storage capacity of the photodiode must be favored during the generation step, while allowing complete extraction of the electrons out of the photodiode during the transfer step. Thanks to the invention, this combination is achieved by means of a variable electrical potential applied by the circuit 10 to the portion 5 of the control electrode. Preferably, the electrical potential applied at the first instant $t_1$ in the electron generation step is higher than the electrical potential applied at the second instant $t_2$ in the transfer step.

FIG. 4 shows diagrammatically two distributions of the electrical potential within the substrate 100, in the three regions 1, 2 and 3, at the instant $t_1$. The horizontal axis represents the depth e in the substrate 100 from the surface S, parallel to the direction D but in the opposite sense, in the regions 1–3. The vertical axis, directed downwards, represents the electrical potential at each depth e. The n-doped region 2 constitutes an electrical potential well, with a minimum value of the electrical potential greater than the values in the p-doped regions 1 and 3. The junctions between the regions 1 and 2 and between the regions 2 and 3 correspond to localized variations in the electrical potential. The electrical potential of the region 3 is fixed by that of the bulk of the substrate 100 to which the region 3 is adjacent: due to the electrical circuit, it is permanently zero.

When the electrical potential of the region 1 is identical to that of the region 3, the region 2 constitutes an electrical potential well having a depth of 3 volts for example. This situation corresponds to the electrical potential distribution curve shown dotted in FIG. 4.

At the instant $t_1$, when the circuit 10 applies a positive electrical potential, for example about 2 volts, to the portion 5, the bottom of the electrical potential well of the region 2 is lowered, for example down to 4 volts. This situation corresponds to the curve shown by the solid line in FIG. 4. The electron storage capacity of the region 2 is therefore increased relative to the situation in which the region 1 is maintained at the electrical potential of the region 3.

The blooming limit of the photodiode is consequently pushed back towards a flux F of higher intensity, that is to say: the light flux intensity range corresponding to linear detection by the photodiode is extended.

The positive bias of the region 1 also results in better confinement of the electrons in the photodiode during the generation step. For a photodiode belonging to an array of juxtaposed photodiodes on the surface of a common substrate, there is less electron migration, called crosstalk, between two adjoining photodiodes. Crosstalk is therefore reduced.

At the instant $t_2$, extraction of the electrons from the photodiode is controlled by means of the gate TG. At the same time, the circuit 10 can apply an electrical potential to the portion 5 that is less than or equal to the electrical potential of the bulk substrate 100. Preferably, the electrical potential applied is equal to that of the bulk of the substrate 100.

It will be apparent to those skilled in the art that alternative embodiments may be proposed that differ from the configuration of the photodiode described in detail above. Such alternative embodiments fall within the invention, provided that the external electrical connection to the region 1 is formed by two separate portions 4 and 5 that are arranged in the manner provided in the invention. In particular, several different methods may be used for producing the intermediate portion 4, each of which maintains the quality and the integrity of the material of the substrate in the region 1.

The method of controlling a photodetector comprising such a photodiode may also be modified. Such a modified method also lies within the invention, especially provided that the region 1 is biased positively with respect to the bulk of the substrate 100, at least at an instant in the step of generating electrons in the photodiode. The type of doping, p or n, of each region of the photodiode may be changed, on condition that the signs of the electrical potentials on which implementation of the invention depend are reversed.

When this technology is applied to miniaturized photo cameras, such as found in mobile communications equipments, these cameras can be made smaller with identical performances for capering images, or will have improved performances when the size is constant.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A photodiode having three doped regions, comprising:
a first doped region, doped with a first type of doping, adjacent to a surface of a substrate;
a second doped region, doped with a second type of doping different from the first type, located on an opposite side of the first doped region with respect to the surface of the substrate; and
a third doped region, doped with the first type of doping, located on an opposite side of the second doped region with respect to the first doped region
a bulk of the substrate and the second doped region forming first and second electrodes of the photodiode, respectively, a third electrode in contact with the first doped region, the third electrode having an intermediate portion of a first electrically conducting material, placed in contact with the first doped region; and
an external connection portion of a second electrically conducting material, placed in contact with the intermediate portion; and a volume of an electrically insulating material supported by the substrate, the intermediate portion having an extension supported by the volume of insulating material, wherein the external connection portion is in contact with said extension.

2. The photodiode according to claim 1, wherein the first and second conducting materials are different.

3. The photodiode according to claim 1, wherein the first conducting material and the substrate are based on silicon.

4. A photodetector comprising a photodiode according to claim 1 and comprising a control circuit connected via a first terminal to a bulk of the substrate and via a second terminal to an external connection portion, and configured to apply a variable electrical potential to the external connection portion between a first instant for generating electrical charges in the photodiode and a second instant for transferring the electrical charges generated out of the photodiode, the electrical potential of the bulk of the substrate being taken as reference.

5. The photodetector according to claim 4, wherein the electrical charges are electrons and wherein the electrical potential applied at said first instant is higher than the electrical potential applied at said second instant.

6. The photodetector according to claim 5, wherein the electrical potential applied at said second instant ($t_2$) is less than or equal to the electrical potential of the bulk of the substrate.

7. The photodiode according to claim 1 wherein the first and second conducting materials are the same material.

8. A photosensitive system including a photodiode having three doped regions comprising:
- a first doped region, doped with a first type of doping, adjacent to a surface of a substrate;
- a second doped region, doped with a second type of doping different from the first type, located on an opposite side of the first doped region with respect to the surface of the substrate; and
- a third doped region, doped with the first type of doping, located on an opposite side of the second doped region with respect to the first doped region
- a bulk of the substrate and the second doped region forming first and second electrodes of the photodiode, respectively, a third electrode in contact with the first doped region, the third electrode having an intermediate portion of a first electrically conducting material, placed in contact with the first doped region,
- an external connection portion of a second electrically conducting material, placed in contact with the intermediate portion; and
- a volume of an electrically insulating material supported by the substrate, the intermediate portion having an extension supported by the volume of insulating material, wherein the external connection portion is in contact with said extension.

* * * * *